United States Patent
Kobayashi et al.

(10) Patent No.: US 7,158,068 B2
(45) Date of Patent: Jan. 2, 2007

(54) TECHNIQUE FOR COMPARING ANALOG SIGNAL WITH REFERENCE VOLTAGE

(75) Inventors: Shigeto Kobayashi, Gifu (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/067,946

(22) Filed: Mar. 1, 2005

(65) Prior Publication Data

US 2005/0219109 A1 Oct. 6, 2005

(30) Foreign Application Priority Data

Mar. 19, 2004 (JP) .............................. 2004-081002

(51) Int. Cl.
*H03M 1/12* (2006.01)
(52) U.S. Cl. .................... 341/155; 341/158; 341/159
(58) Field of Classification Search ................ 341/155, 341/118, 120, 161, 158, 159, 172
See application file for complete search history.

(56) References Cited

U.S. PATENT DOCUMENTS

| | | | | |
|---|---|---|---|---|
| 5,736,951 A | * | 4/1998 | Kobatake ..................... | 341/159 |
| 5,877,718 A | * | 3/1999 | Andoh et al. ................ | 341/155 |
| 5,936,437 A | * | 8/1999 | Kusumoto et al. ............ | 327/94 |
| 6,072,416 A | * | 6/2000 | Shima ......................... | 341/159 |
| 6,288,665 B1 | * | 9/2001 | Tsukamoto et al. ......... | 341/155 |
| 6,459,394 B1 | * | 10/2002 | Nadi et al. ................... | 341/120 |
| 6,518,898 B1 | * | 2/2003 | Choksi ........................ | 341/118 |
| 6,606,042 B1 | * | 8/2003 | Sonkusale et al. .......... | 341/120 |
| 6,816,103 B1 | * | 11/2004 | Jonsson et al. .............. | 341/160 |
| 2002/0067301 A1 | * | 6/2002 | Steinbach .................... | 341/156 |
| 2003/0080892 A1 | * | 5/2003 | Nozaki ........................ | 341/158 |

FOREIGN PATENT DOCUMENTS

JP 09-275342 10/1997

* cited by examiner

Primary Examiner—Linh V. Nguyen
(74) Attorney, Agent, or Firm—McDermott Will & Emery LLP (57) ABSTRACT

The present invention provides a technique for reducing power consumption of an A/D converting device. An A/D converting device according to the present invention includes: multiple comparators each of which has a function for comparing input analog signals with a predetermined reference voltage; an A/D converter for converting the input analog signal into the digital signal with a predetermined number of bits using comparison results from the multiple comparators; a determining unit for determining which range the voltage of the input analog signal belongs to before the comparators comparing the input analog signal with the reference voltages; and a control unit for controlling power supply for the multiple comparators corresponding to the range determined by the determining unit. Thus, power is supplied only to the comparators necessary for this particular A/D conversion, thereby reducing power consumption.

9 Claims, 9 Drawing Sheets

TECHNIQUE FOR COMPARING ANALOG SIGNAL WITH REFERENCE VOLTAGE

BACKGROUND OF THE INVENTION

1. Field of the Invention

The present invention relates to a technique for processing analog signals, and particularly to a comparing device for comparing analog signals with a reference voltage, a method thereof, an analog/digital converting device for converting analog signals into digital signals using the comparing device, and a determining device used for the comparing device.

2. Description of the Related Art

As an example of a circuit for converting input analog signals into digital signals, a pipeline A/D-converter is known (e.g., Japanese Laid-Open Patent Publication No. 9-275342). The pipeline A/D converter is formed of multiple low-bit sub-A/D converters connected one to another. With such a configuration, the pipeline A/D converter performs A/D conversion in steps, by actions of each sub-A/D converter. Each sub-A/D converter includes multiple comparators for comparing input analog signals with a reference voltage, whereby the analog signals are converted into digital signals.

In recent years, rapidly advancing fields such as image processing, communication, and so forth, require a technique for processing digital signals with higher precision at a higher speed. Accordingly, development of an A/D converter for performing high-speed and multi-bit A/D conversion is being undertaken. However, a high-speed A/D converter requires high-speed comparators forming the A/D converter, leading to increased power consumption of the comparators. Furthermore, in general, such a multi-bit A/D converter requires a greater number of comparators. Accordingly, realizing such a high-speed multi-bit A/D converter demands developing of a technique which enables effective comparison with as small a number of comparators as possible while reducing power consumption of each comparator.

SUMMARY OF THE INVENTION

The present invention has been made in view of the above problems, and accordingly, it is an object thereof to provide a technique for reducing power consumption of a comparing device or an analog/digital converting device.

A first aspect of the present invention relates to a comparing device. The comparing device comprises multiple comparators for comparing input analog signals with predetermined reference voltages, with the conceivable range of the voltage of the input analog signal being divided into multiple ranges with predetermined thresholds as boundaries, and with power supply for the multiple comparators being controlled corresponding to the range which the voltage of the analog signal belongs to. For example, with a configuration wherein the conceivable range of the voltage of the input analog signal is divided into two ranges, the median of the maximum value and the minimum value of the input analog signal may be employed as the threshold. Such a configuration enables suitable power control such as reduction of power supply for the comparators which are not required for this particular A/D conversion, for example. Thus, such a configuration enables reduction of power consumption of the comparing device.

The comparing device may further comprise: a determining unit for determining which range the voltage of the input analog signal belongs to; and a control unit for controlling power supply for the multiple comparators corresponding to the range determined by the determining unit, with the control unit reducing power supply for the comparators each of which receives a reference voltage outside of the range. Such a configuration reduces power supply for the comparators wherein comparison results are already obvious, thereby reducing power consumption of the comparing device.

A second aspect of the present invention relates to a comparing device. The comparing device comprises multiple comparators for comparing input analog signals with predetermined reference voltages, with the conceivable range of the voltage of the input analog signal being divided into multiple ranges with predetermined thresholds as boundaries, and with the reference voltages, which are to be input to the multiple comparators, being adjusted corresponding to the range which the voltage of the analog signal belongs to. Such a configuration allows adjustment of the reference voltages corresponding to the range of the voltage of the input analog signal, thereby appropriately comparing analog signals with a wider range with a smaller number of comparators. This contributes to reduction of the size of the device, the weight thereof, the cost thereof, and so forth, while reducing the number of the comparators and power consumption.

The comparing device may further comprise: a determining unit for determining which range the voltage of the input analog signal belongs to; and a switching unit for changing the reference voltages input to the multiple comparators corresponding to the range determined by the determining unit, with the switching unit changing the reference voltages such that the range between the maximum value and the minimum value of the reference voltages input to the multiple comparators covers the range determined by the determining unit. This allows appropriate comparison of analog signals using a smaller number of comparators.

Further, a third aspect of the present invention relates to an analog/digital converting device. The analog/digital converting device comprises: an A/D converter including multiple comparators each of which compares input analog signals with a predetermined reference voltage, for converting the input analog signal into the digital signal with a predetermined number of bits using comparison results from the multiple comparators; a determining unit for determining which range the voltage of the input analog signal belongs to, before the comparators comparing the input analog signal with the reference voltages, with regard to multiple ranges into which the conceivable range of the voltage of the input analog signal is divided with predetermined thresholds as boundaries; and a control unit for controlling power supply for the multiple comparators corresponding to the range determined by the determining unit.

An arrangement may be made wherein the aforementioned control unit reduces power supply for the comparators each of which receives a reference voltage outside of the range thus determined. Also, an arrangement may be made wherein the aforementioned control unit stops power supply for the comparators each of which receives a reference voltage outside of the range thus determined. Such a configuration prevent useless power consumption for the comparators which are not required for this particular A/D conversion, thereby reducing power consumption of the comparators and the A/D converting device.

Further, a fourth aspect of the present invention relates to an analog/digital converting device. The analog/digital converting device comprises: an A/D converter including multiple comparators each of which compares input analog signals with a predetermined reference voltage, for converting an input analog signal into a digital signal with a predetermined number of bits using comparison results from the multiple comparators; a determining unit for determining which range the voltage of the input analog signal belongs to, before the comparators comparing the input analog signal with the reference voltages, with regard to multiple ranges into which the conceivable range of the voltage of the input analog signal is divided with predetermined thresholds as boundaries; and a switching unit for changing the reference voltages input to the multiple comparators corresponding to the range determined by the determining unit.

The aforementioned A/D converter may include a smaller number of comparators than those required for forming an A/D converter having a function for converting the input analog signal into the digital signal with the predetermined number of bits, with at least one of the multiple comparators being operated so as to compare the input analog signal with multiple kinds of reference voltages by switching the reference voltage. With such a configuration, the aforementioned reference voltages may be changed such that the range thus determined by the aforementioned determining unit is included within a range between the maximum value and the minimum value of the reference voltages input to the aforementioned multiple comparators. That is to say, an arrangement may be made wherein the determining unit roughly determines which range the voltage of the input analog signal belongs to, and the reference voltages are changed such that the input analog signal in the range thus determined is appropriately converted into the digital signal. Such a configuration enables reduction of the number of the comparators, thereby reducing the circuit area while reducing power consumption.

The aforementioned analog/digital converting device may comprise multiple conversion units each of which includes: the A/D converter; a D/A converter for converting the output from the A/D converter into the analog signal; a subtracter for subtracting the output signal from the D/A converter, from the input analog signal; and an amplifier for amplifying the output signal from the subtracter, with the determining unit being provided for each of the conversion units. The conversion unit may serve as a unit component of a pipeline A/D converter.

At least one of the multiple conversion units may include a switching unit for switching whether the output signal from the amplifier within the same conversion unit is input as the input analog signal, or the output signal from a circuit other than the conversion unit is input as the input analog signal. The conversion unit may serve as a unit component of a cyclic A/D converter.

In the event that the output signal from the amplifier of the upstream conversion unit is used as the input analog signal input to the conversion unit, the determining unit may acquire the output signal from the amplifier, and determine which range the output signal belongs to, before stable output of the output signal at an almost constant value. Such a configuration allows determination which range the voltage of the output signal from the amplifier, i.e., the voltage of the input analog signal, belongs to, at an early stage, thereby allowing selection of the comparators which are to be operated before input of signals to the comparators, in order to control power supply. Furthermore, an arrangement may be made wherein the output signals are input to the comparators after stable output of the output signal from the amplifier.

Further, a fifth aspect of the present invention relates to a determining device. The determining device determines which range the voltage of the input analog signal belongs to beforehand by comparing the input analog signal with predetermined thresholds, from multiple ranges into which the conceivable range of the voltage of the input analog signal input to a circuit other than the determining device is divided with the thresholds as boundaries. With such a configuration, the circuit for processing the input analog signals acquires the range which the voltage of the input analog signal belongs to beforehand, thereby enabling suitable processing corresponding to the range.

Further, a sixth aspect of the present invention relates to a method for comparing analog signals. The comparison method comprises: determining which range the voltage of the input analog signal belongs to, before multiple comparators comparing the input analog signal with reference voltages, with regard to multiple ranges into which the conceivable range of the voltage of the input analog signal is divided with the thresholds as boundaries; and controlling power supply for the multiple comparators corresponding to the range determined in the determining step.

Further, a seventh aspect of the present invention relates to a method for comparing analog signals. The comparison method comprises: determining which range the voltage of the input analog signal belongs to, before multiple comparators comparing the input analog signal with reference voltages, with regard to multiple ranges into which the conceivable range of the voltage of the input analog signal is divided with the thresholds as boundaries; and changing the reference voltages input to the multiple comparators corresponding to range determined in the determining step.

Moreover, this summary of the invention does not necessarily describe all necessary features so that the invention may also be sub-combination of these described features.

DETAILED DESCRIPTION OF THE INVENTION

The invention will now be described based on preferred embodiments which do not intend to limit the scope of the present invention but exemplify the invention. All of the features and the combinations thereof described in the embodiments are not necessarily essential to the invention.

(First Embodiment)

An A/D converting device including comparing units according to a first embodiment has a configuration wherein the range, which the voltage of an analog signal input to each sub-A/D converter belongs to, is determined beforehand, and power is supplied to only the comparators necessary for this particular A/D conversion for converting the analog signal into the digital signal; the analog signal being in the range determined in the aforementioned determination processing, thereby reducing power consumption of the comparing units included within the sub-A/D converters. Thus, such a configuration enables reduction of power consumption of the comparing units and the A/D converting device.

Figure 1:
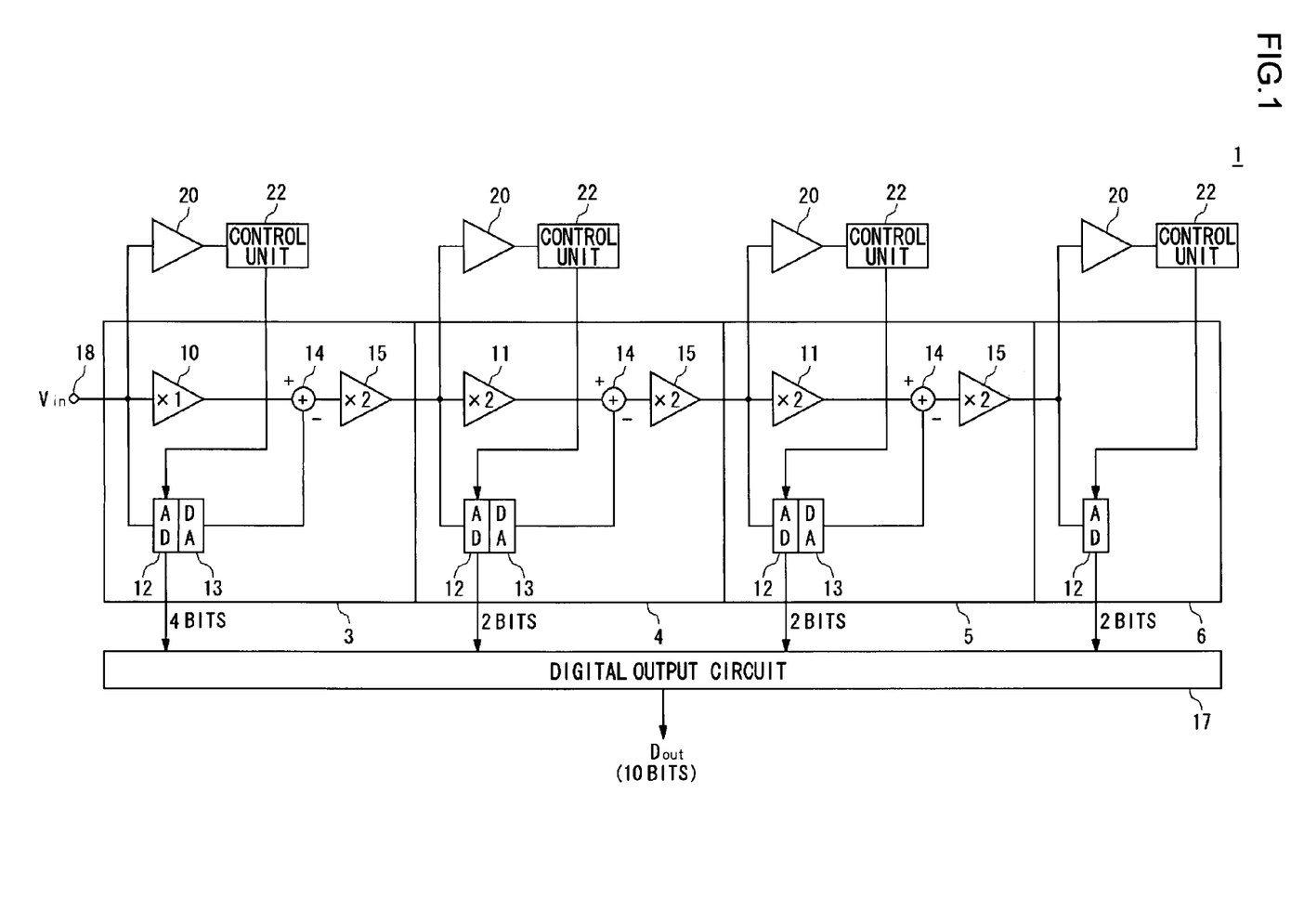
FIG. 1 is a diagram which shows a configuration of an A/D converting device according to a first embodiment.

FIG. 1 shows a configuration of an A/D converting device 1 according to the first embodiment. The A/D converting device 1 has a configuration wherein sub-A/D conversion units 3, 4, 5, and 6, are connected in series. The first sub-A/D conversion unit 3 includes a first amplifier 10, an A/D converter 12, a D/A converter 13, a subtracter 14, and a second amplifier 15. Each of the second sub-A/D conversion unit 4 and the third sub-A/D conversion unit 5 includes a first amplifier 11, and also the A/D converter 12, D/A converter 13, subtracter 14, and second amplifier 15. The final sub-A/D conversion unit 6 includes only the A/D converter 12. Note that while FIG. 1 shows an example of a single-ended circuit configuration for simplification, an arrangement may be made with a differential circuit configuration.

The analog signal Vin input to an input terminal 18 is input to the A/D converter 12 of the first sub-A/D conversion unit 3, and is converted into a digital signal with a predetermined number of bits. In the example shown in FIG. 1, the first A/D converter 12 outputs 4-bit digital signals. The digital signals are output to a digital output circuit 17 and the D/A converter 13. The D/A converter 13 converts the digital signal output from the A/D converter 12 into an analog signal. The first amplifier 10 samples and holds the input analog signal Vin, and outputs the signal to the subtracter 14. The subtracter 14 subtracts the analog signal output from the D/A converter 13, from the analog signal output from the first amplifier 10. The second amplifier 15 amplifies the analog signal output from the subtracter 14 with an amplification factor of 2. Note that the amplification factor of the second amplifier 15 is not restricted to 2; rather, an amplifier with any desired amplification factor may be employed as the second amplifier 15. The output signal from the second amplifier 15 is input to the first amplifier 11 and the A/D converter 12 of the downstream sub-A/D conversion unit 4.

The A/D converter 12 of the second sub-A/D conversion unit 4 outputs 2-bit digital signals to the digital output circuit 17. The D/A converter 13 converts the digital signal output from the A/D converter 12, into the analog signal, amplifies the analog signal with an amplification factor of 2, and outputs the amplified signal to the subtracter 14. The first amplifier 11 samples and holds the input analog signal, amplifies the analog signal with an amplification factor of 2, and outputs the amplified signal to the subtracter 14. Note that the amplification factor of the first amplifier 11 and the D/A converter 13 is not restricted to 2, and that an amplifier and a D/A converter with a desired amplification factor may be employed as the first amplifier 11 and the D/A converter 13, respectively. Furthermore, an arrangement may be made without the first amplifier 11. With such a configuration, the D/A converter 13 outputs the analog signal to the subtracter 14 with an amplification factor of 1. For example, with a configuration wherein the A/D converter 12 acquires 2-bit digital signals, an arrangement is preferably employed wherein the analog signal is amplified with an amplification factor of 4 by actions of the first amplifier 11 and the second amplifier 15.

The third sub-A/D conversion unit 5 acquires two-bit digital signals in the same way as with the second sub-A/D conversion unit 4. Subsequently, the final sub-A/D conversion unit 6 acquires two-bit signals by actions of the A/D converter 12, whereby conversion of the input analog signal into the digital signal is performed. The digital output circuit 17 outputs a 10-bit digital signal wherein the digital signals acquired by the four sub-A/D conversion units are totaled up.

Next, description will be made regarding the functions of a determining unit 20. An conceivable voltage range of the input analog signal input to the sub-A/D conversion unit is divided into multiple ranges with predetermined thresholds as boundaries beforehand. A determining unit 20 determines which range the voltage of the input analog signal belongs to. With the present embodiment, the determining unit 20 is realized in the form of a comparator. That is to say, the determining unit 20 compares the input analog signal with a predetermined reference voltage so as to determine whether the voltage of the input analog signal belongs to a higher range than the reference voltage, or belongs to a lower range. A control unit 22 controls power supply for multiple comparators included in the A/D converter 12 based upon the voltage range of the input analog signal determined by the determining unit 20. Detailed description will be made later regarding the operations of the determining unit 20 and the control unit 22.

While FIG. 1 shows an example wherein each of the sub-A/D conversion units 3, 4, 5, and 6 includes the determining unit 20, an arrangement may be made wherein at least one of the sub-A/D conversion units 3, 4, 5, and 6 include the determining unit 20. With such a configuration as shown in FIG. 1 wherein each of the sub-A/D conversion units 3, 4, 5, and 6 includes the determining unit 20, the range of the input analog signal input to each sub-A/D conversion unit is appropriately determined so as to control power supply for the comparators included in the A/D converter 12, thereby effectively reducing power consumption. Also, while FIG. 1 shows an example wherein each of the A/D conversion units 3, 4, 5, and 6, includes the control unit 22, an arrangement may be made wherein only the A/D conversion units having the determining unit 20 include the control unit 22. Furthermore, an arrangement may be made wherein the single control unit 22 controls power supply for the comparators included in the multiple or all the A/D converters 12.

Figure 2:
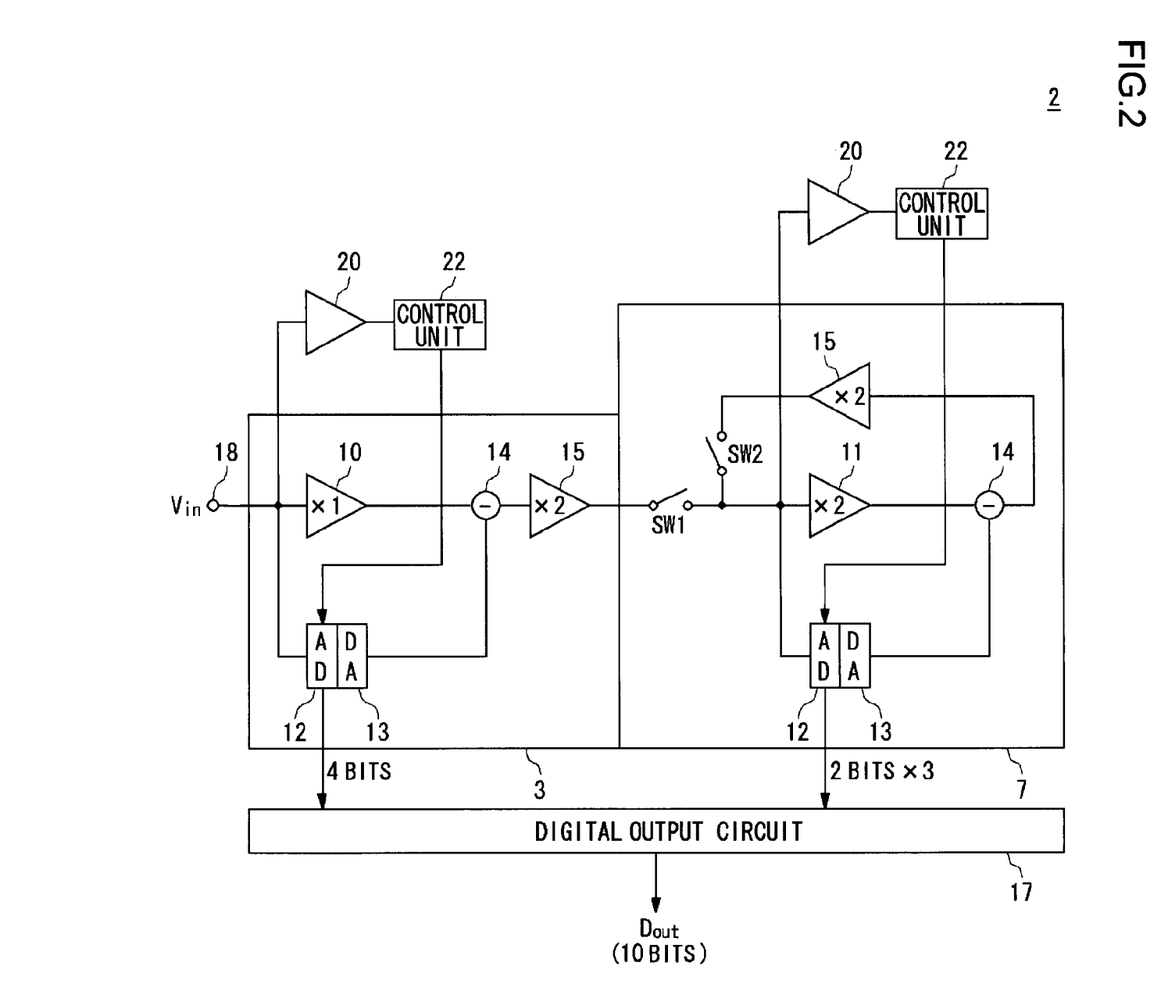
FIG. 2 is a diagram which shows another example of the configuration of the A/D converting device according to the first embodiment.

FIG. 2 shows another arrangement of the A/D converting device according to the first embodiment. An A/D converting device 2 has a configuration wherein a sub-A/D conversion units 3 and 7 are connected in series. The first sub-A/D conversion unit 3 includes the first amplifier 10, A/D converter 12, D/A converter 13, subtracter 14, and second amplifier 15. The second sub-A/D conversion unit 7 includes the first amplifier 11, A/D converter 12, D/A converter 13, subtracter 14, second amplifier 15, and switches SW1 and SW2. While FIG. 2 shows an example of a single-ended circuit configuration for simplification, an arrangement may be made with a differential circuit configuration.

The sub-A/D conversion unit 3 converts the analog signal Vin input to an input terminal 18 into the digital signal with a predetermined number of bits in the same way as described above with reference to FIG. 1, and the output signal from the second amplifier 15 is input to the downstream sub-A/D conversion unit 7. The sub-A/D conversion unit 7 has the switches SW1 and SW2 for switching whether the output signal from the second amplifier 15 of the sub-A/D conversion unit 7 is to be used as the input analog signal for the A/D converter 12, i.e., to be input to the A/D converter 12 as a feedback signal, or the output signal from the second amplifier 15 of the upstream sub-A/D conversion unit 3 is to be input to the A/D converter 12. First, the SW1 is turned on, the SW2 is turned off, and the output signal from the second amplifier 15 of the upstream sub-A/D conversion unit 3 is input to the A/D converter 12, whereby the A/D converter 12 acquires the digital signal. In subsequent A/D conversions, the SW2 is turned on, the SW1 is turned off, and the output signal from the second amplifier 15 is input to the A/D converter 12 as a feedback signal. With such a configuration, A/D conversion is performed with the same single sub-A/D conversion unit 7 multiple times, thereby acquiring the following lower-bit digital signals. The sub-A/D conversion unit 7 having such a loop configuration allows the user to adjust the number of the A/D-conversion loops so as to realize various types and levels of performance, thereby improving degree-of-freedom from the perspective of circuit design.

Figure 3:
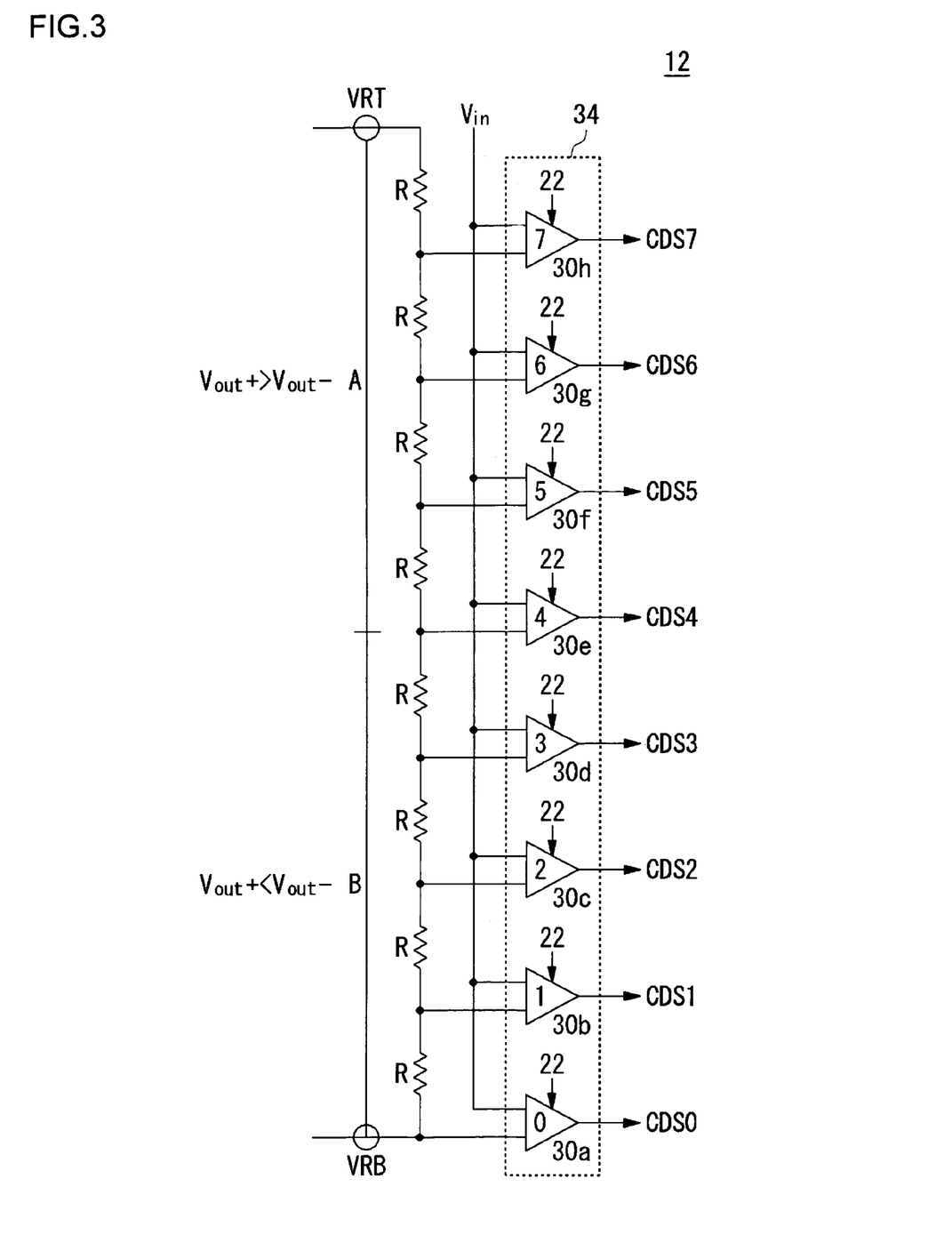
FIG. 3 is a diagram which shows an internal configuration of the A/D converter according to the first embodiment.

FIG. 3 shows an internal configuration of the A/D converter 12 according to the first embodiment. The A/D converter 12 includes a comparing unit 34 having multiple comparators 30$a$ through 30$h$, and resistors R for creating reference voltages input to the comparators 30$a$ through 30$h$. FIG. 3 shows an example of the A/D converter 12 for outputting 3-bit digital signals, which includes eight comparators 30$a$ through 30$h$ and eight resistors R. The eight resistors R each have the same resistance value so as to divide the potential difference between the maximum value VRT and the minimum value VRB of the input analog signal into eight equal voltages, and these voltages thus created are input to the comparators 30$a$ through 30$h$ as the reference voltages. With such a configuration, determination is made which range of these eight voltage ranges the input analog signal belongs to, using the eight comparators 30$a$ through 30$h$. The determination result is converted into the digital signal, and is output to the digital output circuit 17.

With the present embodiment, the determining unit 20 determines beforehand whether the input analog signal input to the A/D, converter 12 is higher or lower than the median of the maximum value VRT and the minimum value VRB. In a case wherein the input analog signal is higher than the median, what the results of comparison would be regarding the comparators 30$a$ through 30$d$, each of which receives the reference voltage lower than the median, is already obvious, and accordingly, power supply is not required for the comparators 30$a$ through 30$d$. Accordingly, in this case, the control unit 22 reduces or stops power supply for the comparators 30$a$ through 30$d$. This enables reduction of power consumption of the comparing unit 34. On the other hand, in a case wherein the input analog signal is lower than the median, the control unit 22 reduces or stops power supply for the comparators 30$e$ through 30$h$ each of which receives the reference voltage higher than the median.

With the A/D converting device having a differential analog circuit, the determining unit 20 compares the positive and negative output signals Vout+ and Vout– output from the upstream second amplifier 15 regarding magnitude, as shown in FIG. 3. With the A/D converting device having a single-ended analog circuit, the median of the maximum voltage and the minimum voltage is preferably input as a reference voltage to the comparator forming the determining unit 20. As described above, determination whether the input analog voltage belongs to an upper range or a lower range with the median as a threshold is equivalent to determination of the uppermost bit of the digital signal which is to be obtained using the A/D converter 12.

As described above, with the comparing unit 34 formed of the multiple comparators 30$a$ through 30$h$, the comparators 30$a$ through 30$h$ are divided into two groups. With such a configuration, power is supplied to the comparator group which has been determined to be operated based upon the conceivable range of the input signal. FIG. 3 shows an example wherein each of the comparators 30$a$ through 30$h$ includes a signal line for receiving a control signal for controlling power supply for each of the comparators 30$a$ through 30$h$. This enables switching of the comparator group which is to be operated, corresponding to the range of the voltage of the input signal. As an another example, an arrangement may be made wherein the control unit 22 directly controls the voltage or electric current applied to the power line for supplying power to each of the comparators 30$a$ through 30$h$.

Furthermore, an arrangement may be made wherein the determining unit 20 includes two or more comparators for determining the range of the voltage of the input analog signal with a greater number of smaller ranges. In this case, an arrangement may be made wherein the control unit 22 reduces or stops power supply for those of the comparators 30$a$ through 30$h$, each of which receives the reference voltage outside of the range thus determined beforehand. Furthermore, the comparing unit 34 may include the determining unit 20 or the control unit 22 therewithin. In this case, the control unit 22 may be formed of a switching device for turning on and off power supply for the comparators 30$a$ through 30$h$.

Figure 4:
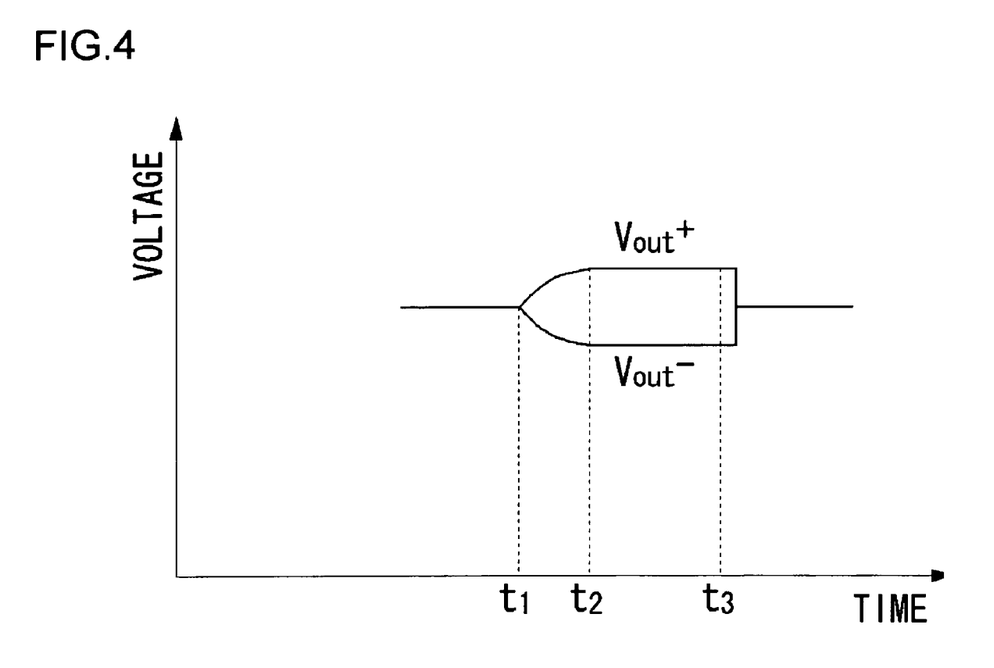
FIG. 4 is a diagram which shows change in the output signal from a second amplifier over time.

FIG. 4 shows change in the output signal from the second amplifier 15 over time. In the drawing, at the time t1, signals are input to the inverting input terminal and the non-inverting input terminal of the second amplifier 15. Subsequently, the difference therebetween increases from 0 at t1 to the stable state at t3. At the time t2, the second amplifier 15 does not yet output a stable signal which is constant over time. However, at this time, the output signal is sufficient for determining which signal of Vout+ and Vout– is greater than the other. Accordingly, the determining unit 20 determines the range of the output signal at this point in time. Subsequently, at the time t3, the second amplifier 15 outputs sufficiently stable output signal, and the output signal is input to the downstream A/D converter 12.

Figure 5:
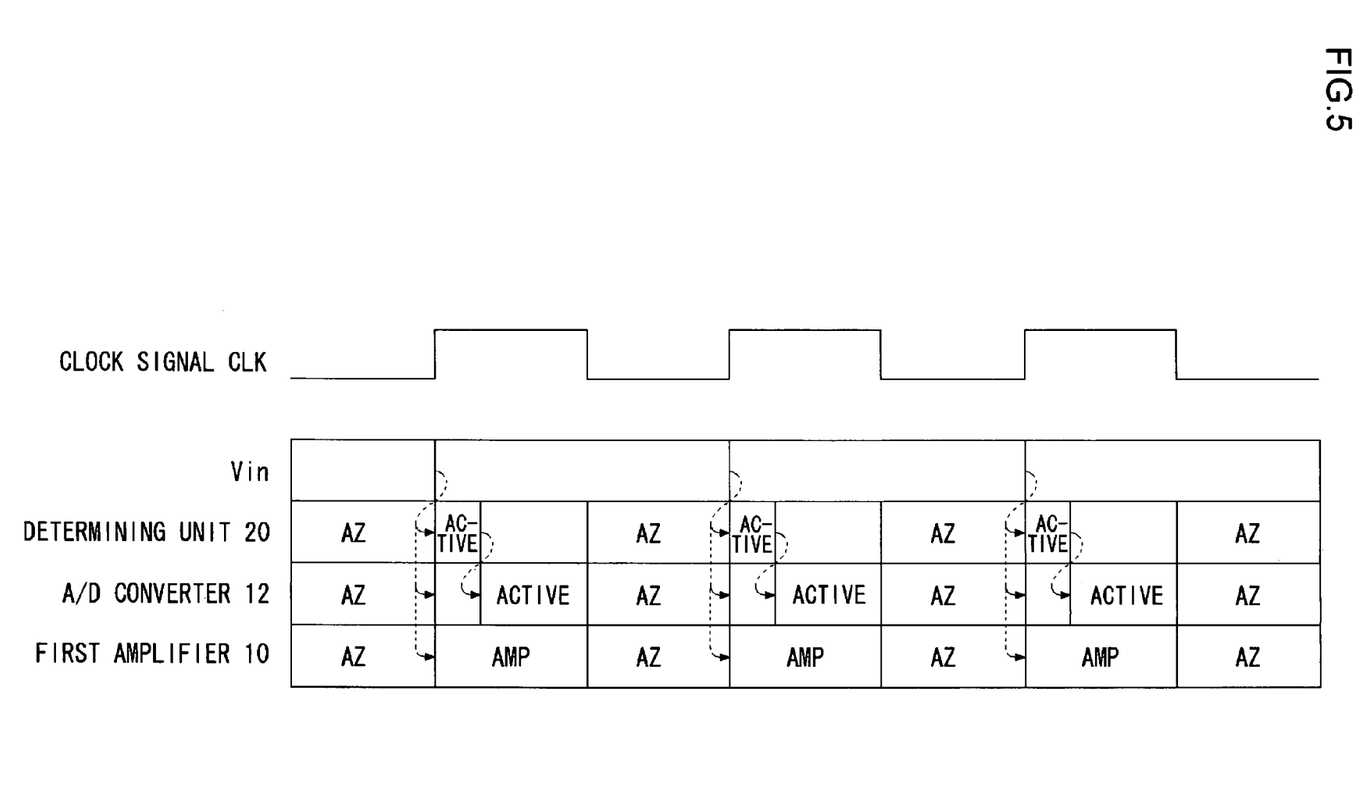
FIG. 5 is a time chart which shows action steps of a first sub-A/D conversion unit.

FIG. 5 is a time chart which shows action steps of the first sub-A/D conversion unit 3. The first amplifier 10 and the first A/D converter 12 sample the input analog signal Vin, synchronously with the leading edge of the clock signal CLK. At the same time, the determining unit 20 samples the input analog signal Vin. Following sampling of the input analog signal Vin, the determining unit 20 compares the input analog signal Vin with the reference voltage, and outputs comparison results to the control unit 22. The control unit 22 transmits control signals to the A/D converter 12 for controlling power supply for the comparators 30$a$ through 30$h$ included in the A/D converter 12. The A/D converter 12 awaits the control signals from the control unit 22. Upon reception of the control signals, the A/D converter 12 operates those of the comparators 30$a$ through 30$h$ which are required for this particular A/D conversion, whereby A/D conversion is performed. The first amplifier 10 holds the sampled input analog signal Vin. The determining unit 20, the A/D converter 12, and the first amplifier 10, perform auto-zero operation, synchronously with the trailing edge of the clock signal CLK.

Figure 6:
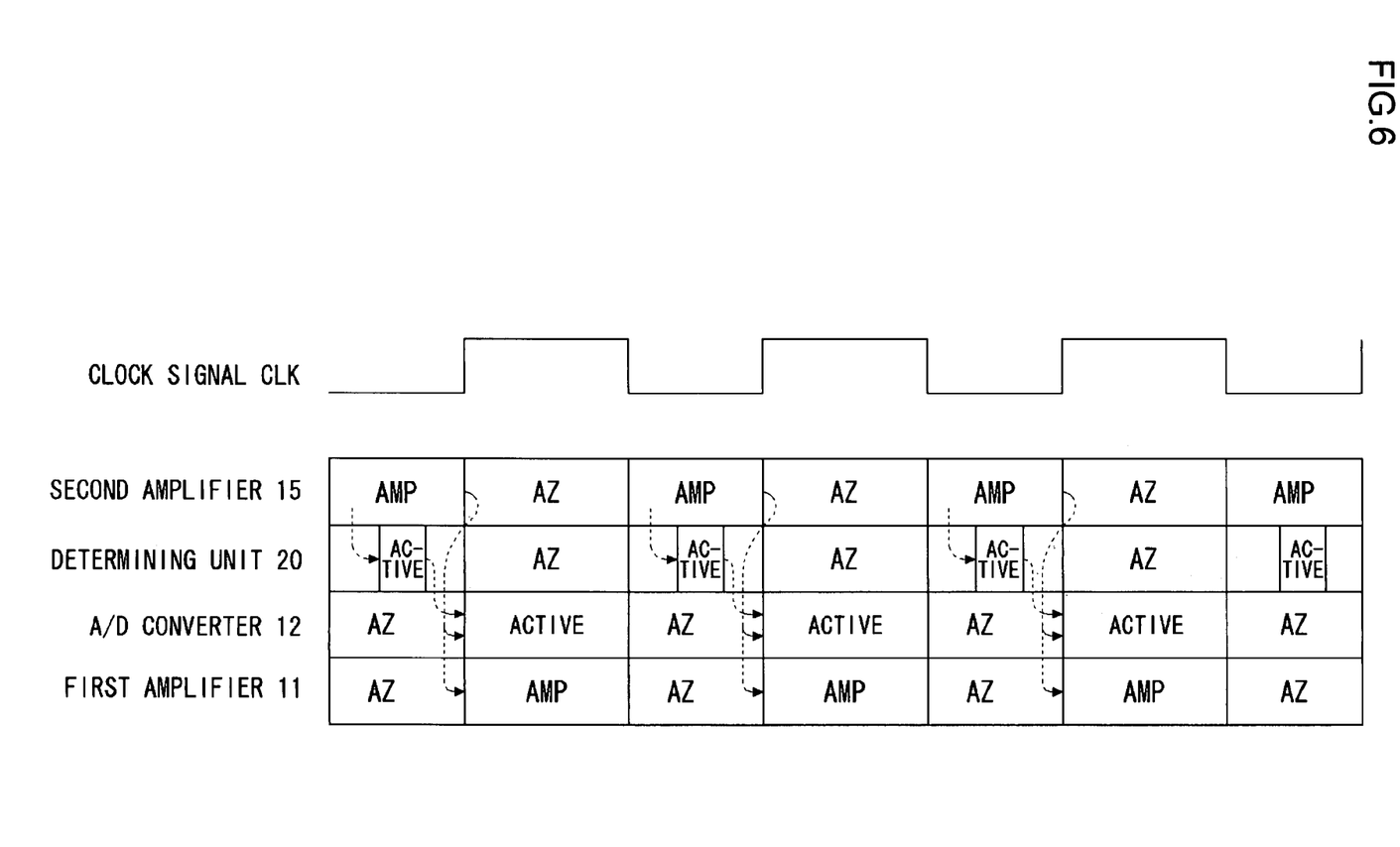
FIG. 6 is a time chart which shows action steps of a second sub-A/D conversion unit and a third sub-A/D conversion unit.

FIG. 6 is a time chart which shows action steps of the second sub-A/D conversion unit 4 and the third sub-A/D conversion unit 5. The determining unit 20 samples the output signal from the second amplifier 15 before the second amplifier 15 outputting the stable signal constant over time, and compares the sampled output signal with the reference voltage, as shown in FIG. 4. The comparison results are transmitted to the A/D converter 12 through the control unit 22 before the timing for operating the A/D converter 12. The first amplifier 11 and the first A/D converter 12 sample the output signal from the second amplifier 15 of the upstream sub-A/D conversion unit, synchronously with the leading edge of the clock signal CLK. At this time, the A/D converter 12 has already received the control signals from the control unit 22. The A/D converter 12 operates those of the comparators 30a through 30h which are required for this particular A/D conversion, whereby A/D conversion is performed. The first amplifier 10 amplifies the sampled analog signal with an amplification factor of 2. The determining unit 20 performs auto-zero operation, synchronously with the leading edge of the clock signal CLK. The A/D converter 12 and the first amplifier 11 perform auto-zero operation, synchronously with the trailing edge of the clock signal CLK. The action steps for the final sub-A/D conversion unit 6 are the same as shown in the time chart in the drawing, except for those of the first amplifier 11. As described above, the determining unit 20 determines the range of the input signal prior to the timing for operating the comparing unit 34 of the A/D converter 12, thereby enabling higher-speed A/D conversion.

(Second Embodiment)

With a second embodiment, the reference voltages input to comparators forming a comparing unit of an A/D converter are adjusted corresponding to the range which the voltage of the input analog signal belongs to, and which has been determined by the determining unit. This allows circuit design with a reduced number of comparators, thereby allowing circuit design with a reduced circuit area while reducing power consumption.

Figure 7:
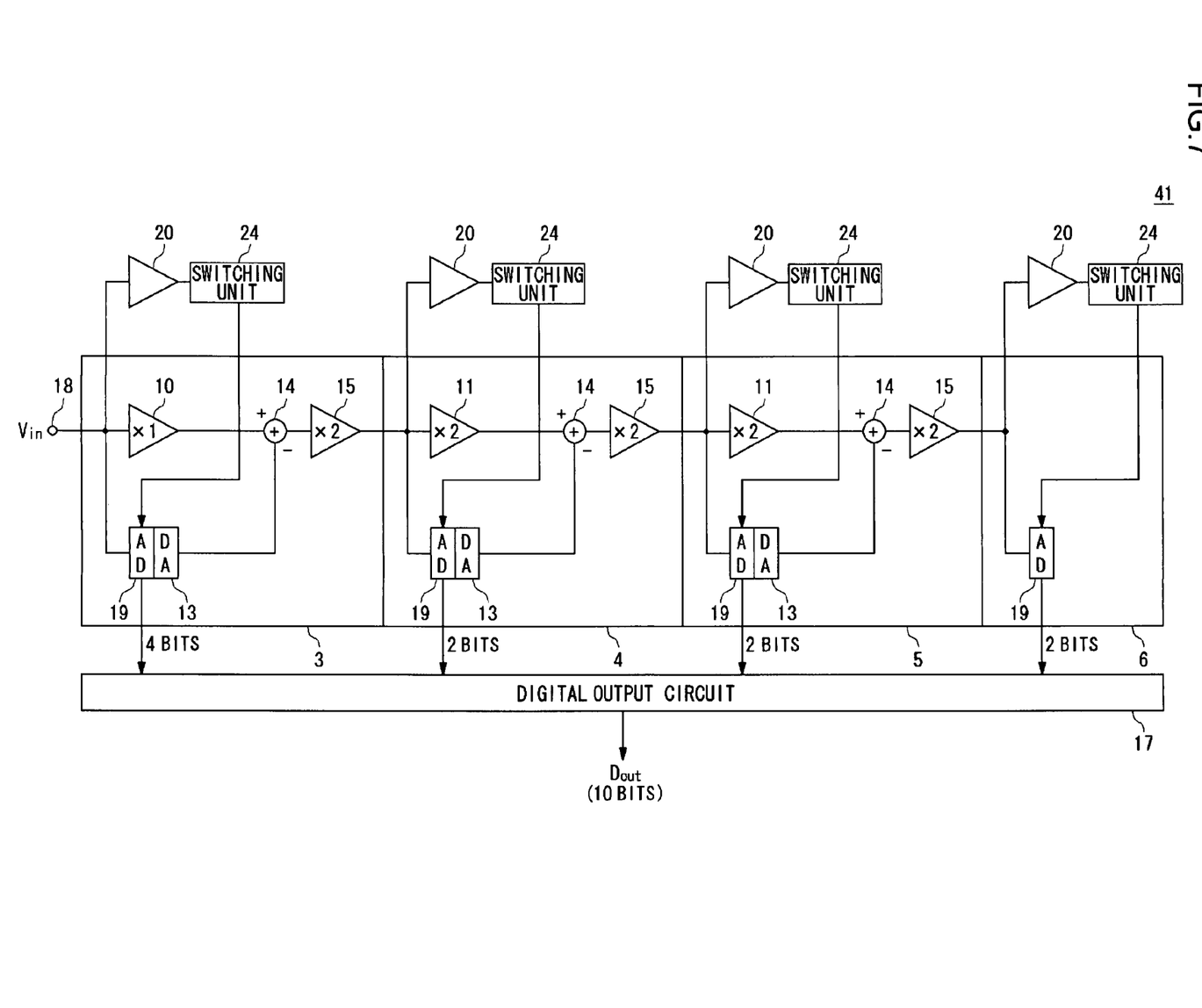
FIG. 7 is a diagram which shows a configuration of an A/D converting device according to a second embodiment.

FIG. 7 shows an A/D converting device 41 according to the second embodiment. Comparing the components of the A/D converting device 41 with those of the A/D converting device 1 according to the first embodiment shown in FIG. 1, the A/D converting device 41 includes switching units 24 instead of the control units 22, and A/D converters 19 instead of the A/D converters 12. The other components and operation of the A/D converting device 41 are the same as those according to the first embodiment, and the same components are denoted by the same reference numerals. The switching unit 24 adjusts the reference voltages input to the comparators of the A/D converter 19 corresponding to the range of the voltage of the input analog signal determined by the determining unit 20.

Figure 8:
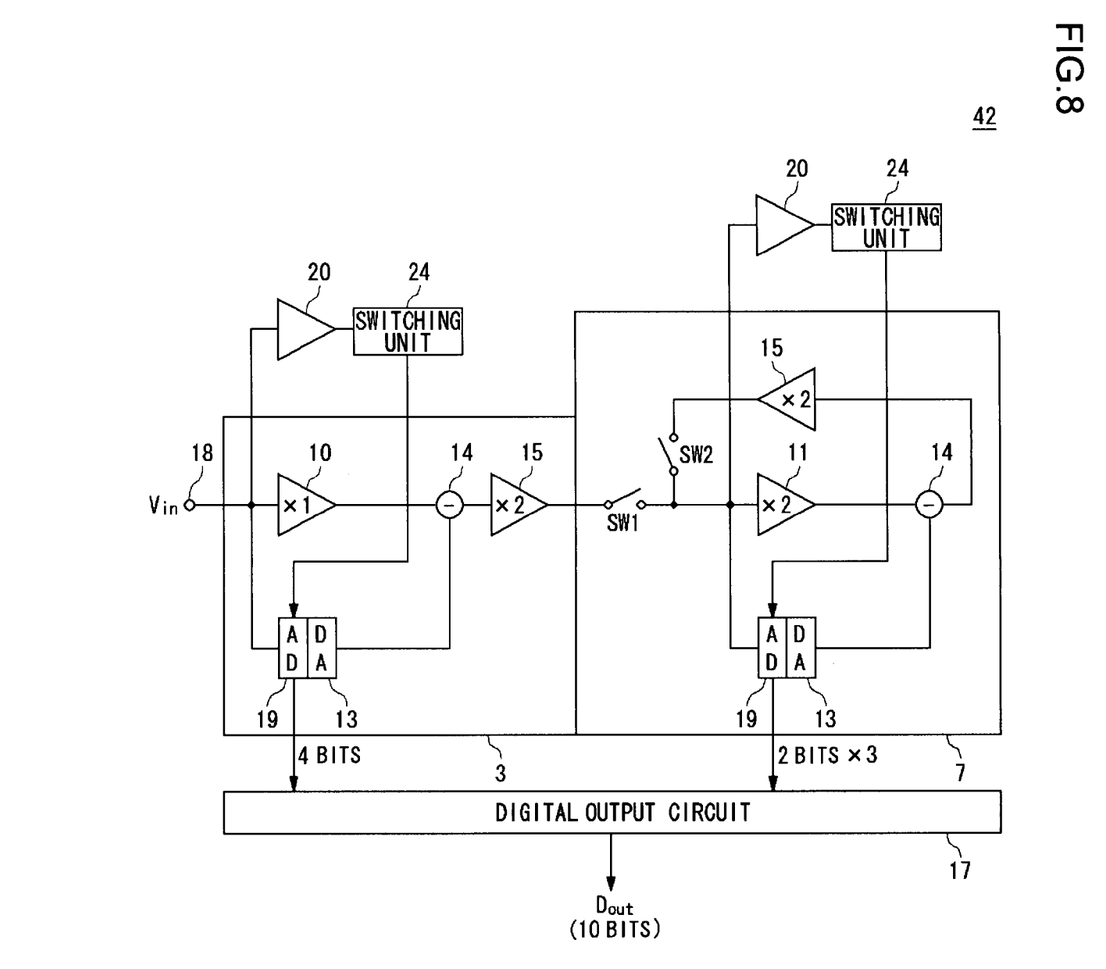
FIG. 8 is a diagram which shows another configuration of the A/D converting device according to the second embodiment.

FIG. 8 shows a configuration of an A/D converting device 42 according to the second embodiment. Comparing the components of the A/D converting device 42 with those of the A/D converting device 2 according to the first embodiment shown in FIG. 2, the A/D converting device 42 includes switching units 24 instead of the control units 22, and A/D converters 19 instead of the A/D converters 12. The other components and operation of the A/D converting device 42 are the same as those according to the first embodiment, and the same components are denoted by the same reference numerals. The switching unit 24 adjusts the reference voltages input to the comparators of the A/D converter 19 corresponding to the range of the voltage of the input analog signal determined by the determining unit 20.

Figure 9:
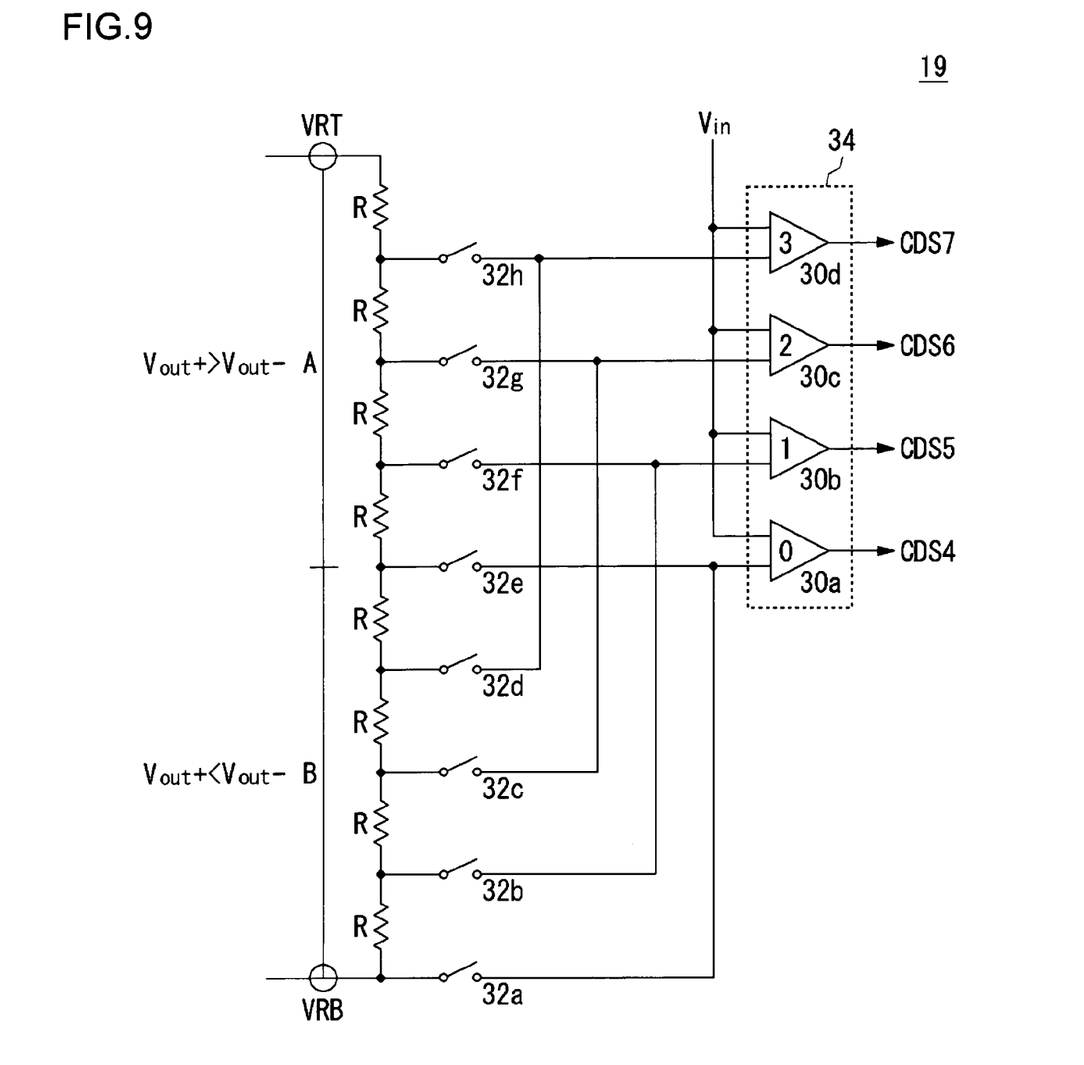
FIG. 9 is a diagram which shows an internal configuration of the A/D converter according to the second embodiment.

FIG. 9 shows an internal configuration of the A/D converter 19 according to the second embodiment. Comparing the components of the A/D converter 19 with those of the A/D converter 12 according to the first embodiment shown in FIG. 3, the A/D converter 19 includes switches 32a through 32h for switching the reference voltages input to the comparators 30a through 30d, which is formed of a half number of the comparators as compared with those according to the first embodiment. That is to say, the comparing unit 34 of the A/D converter 19 does not include all eight comparators necessary for forming an A/D converter having a function for converting analog signals into the 3-bit digital signals, i.e., includes fewer comparators. However, such a configuration wherein the reference voltages are switched allows each comparator to compare the input analog signal with multiple kinds of reference voltages, thereby enabling circuit design with half as many comparators.

Specifically, in the event that the determining unit 20 has determined that Vout+ is greater than Vout− regarding the output signals from the upstream second amplifier 15, the switching unit 24 turns on the switches 32e through 32h, and turns off the switches 32a through 32d. As a result, the comparators 30a through 30d receives reference voltages in the range A corresponding to the case wherein Vout+ is greater than Vout−. On the other hand, in the event that the determining unit 20 has determined that Vout+ is smaller than Vout− regarding the output signals from the upstream second amplifier 15, the switching unit 24 turns off the switches 32e through 32h, and turns on the switches 32a through 32d. As a result, the comparators 30a through 30d receives reference voltages in the range B. That is to say, the comparator 30a has functions serving as the comparators 30a and 30e according to the first embodiment, for example.

Furthermore, an arrangement may be made wherein the determining unit 20 includes two or more comparators for determining the range of the voltage of the input analog signal with a greater number of ranges each of which is smaller. With such a configuration, the switching unit 24 switches the reference voltages input to the comparators 30 such that the range between the maximum value and the minimum value of the reference voltages input to the multiple comparators covers the range determined by the determining unit 20.

As described above, description has been made regarding the present invention with reference to the aforementioned embodiments. The above-described embodiments have been described for exemplary purposes only, and are by no means intended to be interpreted restrictively. Rather, it can be readily conceived by those skilled in this art that various modifications may be made by making various combinations of the aforementioned components or the aforementioned processing, which are also encompassed in the technical scope of the present invention.

What is claimed is:

1. A comparing device, comprising a plurality of comparators for comparing input analog signals with predetermined reference voltages, wherein when the conceivable range of the voltage of said input analog signal is divided into a plurality of ranges with predetermined thresholds as boundaries, power supply for said plurality of comparators is controlled corresponding to the range which the voltage of said analog signal belongs to;

and wherein the power supply for the comparators each of which receives a reference voltage outside of said range is reduced.

2. A comparing device comprising:
a plurality of comparators for comparing input analog signals with predetermined reference voltages;
a determining unit for determining, when the conceivable range of the voltage of said input analog signal is divided into a plurality of ranges with predetermined thresholds as boundaries, which range the voltage of said input analog signal belongs to; and
a control unit for controlling power supply for said plurality of comparators corresponding to said range determined by said determining unit,
wherein said control unit reduces power supply for the comparators each of which receives a reference voltage outside of said range.

3. An analog/digital converting device comprising:
an A/D converter including a plurality of comparators each of which compares input analog signals with a predetermined reference voltage, for converting the input analog signal into the digital signal with a predetermined number of bits using comparison results from said plurality of comparators;
a determining unit for determining which range the voltage of said input analog signal belongs to, before said comparators comparing said input analog signal with said reference voltages, with regard to a plurality of ranges into which the conceivable range of the voltage of said input analog signal is divided with predetermined thresholds as boundaries; and
a control unit for controlling power supply for said plurality of comparators corresponding to the range determined by said determining unit,
wherein said control unit reduces power supply for the comparators each of which receives a reference voltage outside of said range.

4. An analog/digital converting device comprising:
a plurality of conversion units each of which includes:
an A/D converter including a plurality of comparators each of which compares input analog signals with a predetermined reference voltage, for converting the input analog signal into the digital signal with a predetermined number of bits using comparison results from said plurality of comparators;
a D/A converter for converting the output from said A/D converter into the analog signal;
a subtracter for subtracting the output signal from said D/A converter, from said input analog signal; and
an amplifier for amplifying the output signal from said subtracter,
a determining unit for determining which range the voltage of said input analog signal belongs to, before said comparators comparing said input analog signal with said reference voltages, with regard to a plurality of ranges into which the conceivable range of the voltage of said input analog signal is divided with predetermined thresholds as boundaries; and
a control unit for controlling power supply for said plurality of comparators corresponding to the range determined by said determining unit,
wherein said determining unit is provided for each of said conversion units, and
wherein, in the event that the output signal from said amplifier of the upstream conversion unit is used as said input analog signal input to said conversion unit, said determining unit acquires the output signal from said amplifier, and determines which range said output signal belongs to, before stable output of said output signal at an almost constant value.

5. An analog/digital converting device according to claim 4, wherein,
at least one of said plurality of conversion units includes a switching unit for switching whether the output signal from said conversion unit itself is input as said input analog signal, or the output signal from a circuit other than the conversion unit is input as said input analog signal.

6. An analog/digital converting device comprising:
a plurality of conversion units each of which includes:
an A/D converter including a plurality of comparators each of which compares input analog signals with a predetermined reference voltage, for converting an input analog signal into a digital signal with a predetermined number of bits using comparison results from said plurality of comparators;
a D/A converter for converting the output from said A/D converter into the analog signal;
a subtracter for subtracting the output signal from said D/A converter, from said input analog signal; and
an amplifier for amplifying the output signal from said subtracter, and
a determining unit for determining which range the voltage of said input analog signal belongs to, before said comparators comparing said input analog signal with said reference voltages, with regard to a plurality of ranges into which the conceivable range of the voltage of said input analog signal is divided with predetermined thresholds as boundaries; and
a switching unit for changing said reference voltages input to said plurality of comparators corresponding to the range determined by said determining unit,
wherein said determining unit is provided for each of said conversion units, and
wherein, in the event that the output signal from said amplifier of the upstream conversion unit is used as said input analog signal input to said conversion unit, said determining unit acquires the output signal from said amplifier, and determines which range said output signal belongs to, before stable output of said output signal at an almost constant value.

7. An analog/digital converting device according to claim 6 wherein,
said A/D converter includes a smaller number of comparators than those required for forming an A/D converter having a function for converting said input analog signal into said digital signal with the predetermined number of bits,
and wherein at least one of said plurality of comparators is operated so as to compare said input analog signal with plurality kinds of reference voltages by switching said reference voltage.

8. A determining device for determining which range the voltage of the input analog signal belongs to beforehand by comparing said input analog signal with predetermined thresholds, from a plurality of ranges into which the conceivable range of the voltage of said input analog signal input to a circuit other than said determining device is divided with said thresholds as boundaries, for reducing power supply for the circuit which receives a reference voltage outside of the range thus determined.

9. A comparison method for analog signals comprising:
determining which range the voltage of the input analog signal belongs to, before a plurality of comparators comparing said input analog signal with reference voltages, with regard to a plurality of ranges into which the conceivable range of the voltage of said input analog signal is divided with said thresholds as boundaries; and reducing power supply for said comparators each of which receives a reference voltage outside of the range determined in said determining.

* * * * *